US012668717B1

(12) United States Patent
Tsao et al.

(10) Patent No.: US 12,668,717 B1
(45) Date of Patent: Jun. 30, 2026

(54) RESIN COMPOSITION AND ARTICLE MADE THEREFROM

(71) Applicant: Elite Material Co., Ltd., Taoyuan City (TW)

(72) Inventors: Chou-Jung Tsao, Taoyuan City (TW); Zhe-Hao Ou, Taoyuan City (TW); Tse-Hung Liu, Taoyuan City (TW)

(73) Assignee: ELITE MATERIAL CO., LTD., Taoyuan City (TW)

( * ) Notice: Subject to any disclaimer, the term of this patent is extended or adjusted under 35 U.S.C. 154(b) by 0 days.

(21) Appl. No.: 19/216,908

(22) Filed: May 23, 2025

(30) Foreign Application Priority Data

Apr. 30, 2025 (TW) ................................ 114116306

(51) Int. Cl.

| | |
|---|---|
| ***C09D 7/48*** | (2018.01) |
| ***C09D 7/63*** | (2018.01) |
| ***C09D 179/08*** | (2006.01) |
| ***C09J 11/06*** | (2006.01) |
| ***C09J 179/08*** | (2006.01) |
| *H05K 1/03* | (2006.01) |

(52) U.S. Cl.
CPC ........... *C09D 179/085* (2013.01); *C09D 7/48* (2018.01); *C09D 7/63* (2018.01); *C09J 11/06* (2013.01); *C09J 179/085* (2013.01); *H05K 1/0373* (2013.01); *H05K 2201/0209* (2013.01)

(58) Field of Classification Search
CPC .................................................. C09D 179/085
See application file for complete search history.

(56) References Cited

FOREIGN PATENT DOCUMENTS

TW I857885 B 10/2024

*Primary Examiner* — Ian A Rummel
(74) *Attorney, Agent, or Firm* — MUNCY, GEISSLER, OLDS & LOWE, P.C.

(57) ABSTRACT

A resin composition includes 100 parts by weight of a maleimide resin, 50 to 100 parts by weight of a maleic anhydride-modified polyolefin resin and 0.1 to 1.5 parts by weight of a free radical scavenger, wherein the maleimide resin has a structure of Formula (1), and the free radical scavenger includes o-methylhydroquinone, a nitroxide radical compound having a tetramethylpiperidine structure or a combination thereof. The resin composition may be used to make various articles, including a resin-coated copper, a resin film, a laminate or a printed circuit board, and one or more of the properties can be improved, including copper foil peeling strength, resin flow and 5° C. shelf life.

Formula (1)

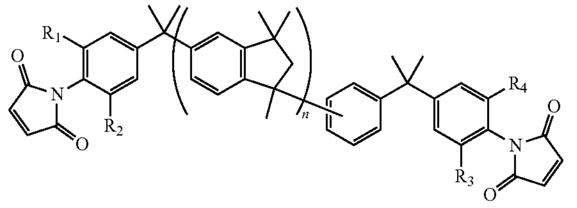

8 Claims, No Drawings

RESIN COMPOSITION AND ARTICLE MADE THEREFROM

CROSS-REFERENCE TO RELATED APPLICATION

This application claims the priority benefits of Taiwan Patent Application No. 114116306, filed on Apr. 30, 2025. The entirety of the above-mentioned patent application is hereby incorporated by reference herein and made a part of this specification.

BACKGROUND

1. Field of the Disclosure

The present disclosure relates to a resin composition and more particularly to a resin composition useful for preparing a resin-coated copper, a resin film, a laminate or a printed circuit board.

2. Description of Related Art

In recent years, due to the development of electronic signal transmission toward 5G and the trend of miniaturization, thin type and high performance of electronic equipment, communication devices and personal computers, circuit boards for these applications were also developed toward multi-layer configuration, high density trace interconnection, and high speed signal transmission, thereby presenting higher challenges to the overall performance of circuit laminates such as copper-clad laminates.

Accordingly, there is a need to provide a novel material meeting the property requirements of circuit boards used nowadays.

SUMMARY

To overcome the problems of prior arts, particularly one or more property demands facing conventional materials, it is a primary object of the present disclosure to provide a resin composition and an article made from the resin composition, which may achieve improvements in at least one or more desirable properties including copper foil peeling strength, resin flow and 5° C. shelf life.

To achieve the above-mentioned objects, the present disclosure provides a resin composition, comprising:

100 parts by weight of a maleimide resin;

50 to 100 parts by weight of a maleic anhydride-modified polyolefin resin; and 0.1 to 1.5 parts by weight of a free radical scavenger;

wherein:

the maleimide resin has a structure of Formula (1):

Formula (1)

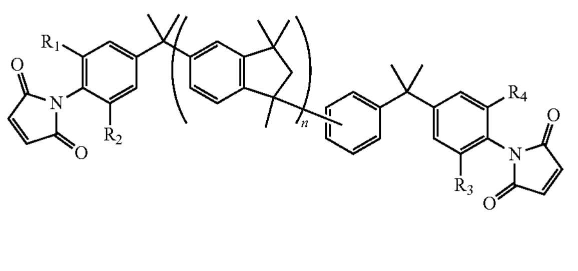

wherein n is an integer of 1 to 10, and $R_1$ to $R_4$ are each independently hydrogen or a C1 to C3 alkyl group;

the free radical scavenger comprises o-methylhydroquinone, a nitroxide radical compound having a tetramethylpiperidine structure or a combination thereof.

For example, in one embodiment, the maleic anhydride-modified polyolefin resin comprises a maleic anhydride-adducted polybutadiene-styrene copolymer (also known as maleic anhydride-grafted polybutadiene-styrene copolymer), a maleic anhydride-adducted polybutadiene (also known as maleic anhydride-grafted polybutadiene) or a combination thereof.

For example, in one embodiment, the nitroxide radical compound having a tetramethylpiperidine structure has a structure of Formula (2):

Formula (2)

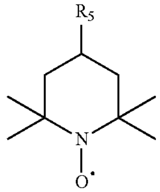

wherein $R_5$ is hydrogen, a C1 to C5 alkyl group, an amino group, a hydroxyl group, a keto group, a tetramethylpiperidine nitroxide radical-substituted phosphite ester group or a carboxyl group.

For example, in one embodiment, the resin composition further comprises inorganic filler, curing accelerator, flame retardant, solvent, silane coupling agent, coloring agent, toughening agent or a combination thereof.

Moreover, the present disclosure also provides an article made from the resin composition described above, which comprises a resin-coated copper, a resin film, a laminate or a printed circuit board.

For example, in one embodiment, articles made from the resin composition disclosed herein have one, more or all of the following properties:

a copper foil peeling strength as measured by reference to IPC-TM-650 2.4.8 of greater than or equal to 4.0 lb/in;

a resin flow as measured by reference to IPC-TM-650 2.3.17 of between 35.0% and 50.0%; and a 5° C. shelf life of greater than or equal to 78 days.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

While some theories or mechanisms may be proposed herein, the present disclosure is not bound by any theories or mechanisms described regardless of whether they are right or wrong, as long as the embodiments can be implemented according to the present disclosure.

As used herein, "a," "an" or any similar expression is employed to describe components and features of the present disclosure. This is done merely for convenience and to give a general sense of the scope of the present disclosure. Accordingly, this description should be read to include one or at least one and the singular also includes the plural unless it is obvious to mean otherwise.

As used herein, "or a combination thereof" means "or any combination thereof", and "any" means "any one", vice versa.

As used herein, the term "comprises," "comprising," "includes," "including," "encompass," "encompassing," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "encompass," "encompassing," "has," "having" or any other variant thereof, it is understood that transitional phrases such as "consisting essentially of" and "consisting of" are also disclosed and included.

As used herein, the term "and" or any other variant thereof is used to connect parallel sentence components, and there is no distinction between the front and rear components. The meaning of the parallel sentence components does not change in the grammatical sense after the position is exchanged.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Similarly, a range of "between 1 and 8" should be understood as explicitly disclosing all ranges such as 1 to 8, 1 to 7, 2 to 8, 2 to 6, 3 to 6, 4 to 8, 3 to 8 and so on and encompassing the end points of the ranges. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.95 to 40.04.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of $X_1$, $X_2$ and $X_3$" and Y is described as being "selected from a group consisting of $Y_1$, $Y_2$ and $Y_3$," the disclosure shall be interpreted as any combination of X is $X_1$ or $X_2$ or $X_3$ and Y is $Y_1$ or $Y_2$ or $Y_3$.

Unless otherwise specified, the term "resin" of the present disclosure is a widely used common name of a synthetic polymer and is construed as comprising monomer and its combination, polymer and its combination or a combination of monomer and its polymer, but not limited thereto.

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property. In addition, as used herein, a mixture refers to a combination of two or more compounds.

Unless otherwise specified, according to the present disclosure, a polymer refers to the product formed by monomer(s) via polymerization and usually comprises multiple aggregates of polymers respectively formed by multiple repeated simple structure units by covalent bonds; the monomer refers to the compound forming the polymer. A polymer may comprise a homopolymer, a copolymer, a prepolymer, etc., but not limited thereto.

A homopolymer refers to the polymer formed by the polymerization of one monomer. A copolymer refers to the polymer formed by the polymerization of two or more different monomers. For example, copolymers may comprise: random copolymers, such as a structure of -AABABBBAAABBA-; alternating copolymers, such as a structure of -ABABABAB-; graft copolymers, such as a structure of -AA(A-BBBB)AA(A-BBBB)AAA-; and block copolymers, such as a structure of -AAAAA-BBBBBB-AAAAA-. The term "polymer" includes but is not limited to an oligomer. An oligomer refers to a polymer with 2-20, typically 2-5, repeating units.

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

As used herein, part(s) by weight represents weight part(s) in any weight unit, such as but not limited to gram, kilogram, pound and so on. For example, 100 parts by weight of the maleimide resin may represent 100 grams of the maleimide resin, 100 kilograms of the maleimide resin or 100 pounds of the maleimide resin, but not limited thereto. As used herein, if the amount of components is presented in a proportional relationship, the actual amount can be any amount that conforms to the proportional relationship.

The following embodiments and examples are illustrative in nature and are not intended to limit the present disclosure and its application. In addition, the present disclosure is not bound by any theory described in the background and summary above or the following embodiments or examples.

As described above, a primary object of the present disclosure is to provide a resin composition, which comprises 100 parts by weight of a maleimide resin, 50 to 100 parts by weight of a maleic anhydride-modified polyolefin resin and 0.1 to 1.5 parts by weight of a free radical scavenger, wherein:

the maleimide resin has a structure of Formula (1):

Formula (1)

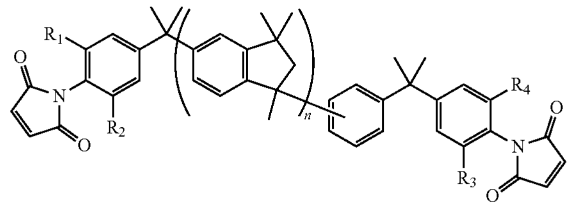

wherein n is an integer of 1 to 10 (such as 1, 2, 3, 4, 5, 6, 7, 8, 9 or 10), and $R_1$ to $R_4$ are each independently hydrogen or a C1 to C3 alkyl group (such as methyl, ethyl, n-propyl or isopropyl);

the free radical scavenger comprises o-methylhydroquinone, a nitroxide radical compound having a tetramethylpiperidine structure or a combination thereof.

For example, in one embodiment, the maleimide resin may have a structure of Formula (1-1), wherein n is an integer of 1 to 10:

Formula (1-1)

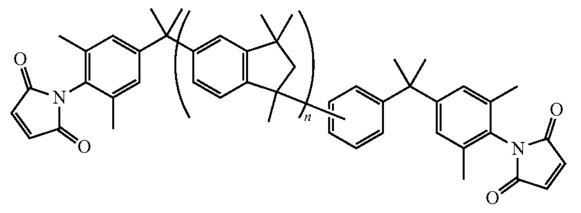

For example, in one embodiment, the maleimide resin may have a structure of Formula (1-2), wherein n is an integer of 1 to 10:

Formula (1-2)

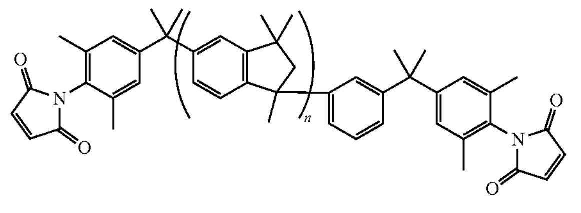

For example, in one embodiment, the maleic anhydride-modified polyolefin resin may comprise any one or more maleic anhydride-modified polyolefin resins. The modification method is not particularly limited and may be any method known in the art for modifying polyolefin resins, such as but not limited to adding a maleic anhydride to the polyolefin resin. The type of the maleic anhydride-modified polyolefin resin is not particularly limited, such as but not limited to polybutadiene-styrene copolymer, polybutadiene, polyisoprene, styrene-butadiene-styrene block copolymer, styrene-isoprene copolymer, styrene-butadiene-divinylbenzene terpolymer, vinyl-polybutadiene-urethane oligomer, hydrogenated styrene-butadiene-styrene block copolymer (also known as styrene-ethylene/butylene-styrene copolymer), or a combination thereof. For example, in one embodiment, the maleic anhydride-modified polyolefin resin comprises a maleic anhydride-adducted polybutadiene-styrene copolymer, a maleic anhydride-adducted polybutadiene or a combination thereof.

For example, in one embodiment, the free radical scavenger comprises o-methylhydroquinone, a nitroxide radical compound having a tetramethylpiperidine structure or a combination thereof. For example, in one embodiment, the free radical scavenger comprises o-methylhydroquinone, 2,2,6,6-tetramethylpiperidine-1-oxyl free radical, tetramethylpiperidine nitroxide radical phosphite triester or a combination thereof.

For example, in one embodiment, the nitroxide radical compound having a tetramethylpiperidine structure has a structure of Formula (2):

Formula (2)

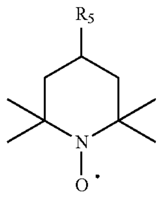

wherein $R_5$ is hydrogen, a C1 to C5 alkyl group, an amino group, a hydroxyl group, a keto group, a tetramethylpiperidine nitroxide radical-substituted phosphite ester group or a carboxyl group.

In the present disclosure, unless otherwise specified, in the structure of Formula (2), the oxygen atom connected to the nitrogen atom may be in the form of free radical or hydroxyl group. In other words, the oxygen free radical and hydroxyl group mentioned above are chemically equivalent.

For example, in one embodiment, the nitroxide radical compound having a tetramethylpiperidine structure has a structure of Formula (2-1):

Formula (2-1)

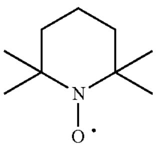

For example, in one embodiment, the nitroxide radical compound having a tetramethylpiperidine structure has a structure of Formula (2-2):

Formula (2-2)

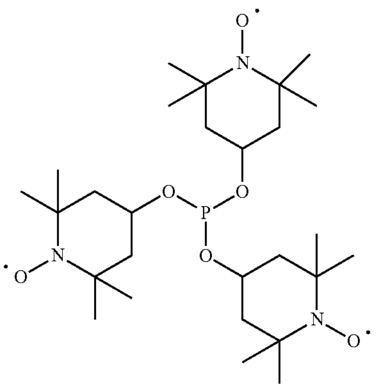

In one embodiment, for example, the resin composition of the present disclosure may further optionally comprise inorganic filler, curing accelerator, flame retardant, solvent, silane coupling agent, coloring agent, toughening agent or a combination thereof. Unless otherwise specified, relative to 100 parts by weight of the maleimide resin, the content of any aforesaid component may be 0.001 to 450 parts by weight, such as 0.001, 0.01, 0.1, 1, 5, 10, 20, 30, 40, 50, 60, 70, 80, 90, 100, 150, 200, 250, 300, 350, 400 or 450 parts by weight, such as 30 to 150 parts by weight, 200 to 300 parts by weight or 350 to 400 parts by weight.

The inorganic filler may be any one or more inorganic fillers used for preparing a resin-coated copper, a resin film, a laminate or a printed circuit board; examples include but are not limited to: silica (fused, non-fused, porous or hollow type), aluminum oxide, aluminum hydroxide, magnesium oxide, magnesium hydroxide, calcium carbonate, aluminum nitride, boron nitride, sintered body formed by aluminum nitride and boron nitride, aluminum silicon carbide, silicon carbide, titanium dioxide, zinc oxide, zirconium oxide, mica, boehmite (AlOOH), calcined talc, talc, silicon nitride, calcined kaolin, hollow porous particle or a combination thereof. Moreover, the inorganic filler can be spherical, fibrous, plate-like, particulate, flake-like, whisker-like or a combination thereof in shape and can be optionally pretreated by a silane coupling agent. For example, relative to 100 parts by weight of the maleimide resin, the amount of inorganic filler used herein is not particularly limited and may for example range from 10 parts by weight to 200 parts by weight or 100 to 300 parts by weight.

The curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), 4-dimethylaminopyridine (DMAP) and tetraphenylphosphonium tetraphenylborate. The Lewis acid may comprise metal salt compounds, such as those of manganese, iron, cobalt, nickel, copper and zinc, such as zinc octanoate or cobalt octanoate.

The curing accelerator may also encompass curing initiator such as a peroxide capable of producing free radicals, and examples of the curing initiator may comprise but not limited to: benzoyl peroxide, dicumyl peroxide, 2,5-dimethyl-2,5-di(t-butylperoxy)hexane, 2,5-dimethyl-2,5-di(t-butylperoxy)-3-hexyne, di-t-butyl peroxide, di(t-butylperoxyisopropyl)benzene, di(t-butylperoxy)phthalate, di(t-butylperoxy)isophthalate, t-butyl peroxybenzoate, 2,2-di(t-butylperoxy)butane, 2,2-di(t-butylperoxy)octane, 2,5-dimethyl-2,5-di(benzoylperoxy)hexane, lauroyl peroxide, t-hexyl peroxypivalate, dibutylperoxyisopropylbenzene, bis(4-t-butylcyclohexyl) peroxydicarbonate or a combination thereof. For example, relative to 100 parts by weight of the maleimide resin, the content of curing accelerator used herein may range from 0.01 to 2 parts by weight, preferably 0.1 to 1.0 part by weight, more preferably 0.3 to 0.8 part by weight.

In one embodiment, the resin composition of the present disclosure may further comprise a flame retardant, and the content of the flame retardant may be adjusted as required. In another embodiment, the resin composition may not contain a flame retardant, which means the content of the flame retardant is 0 part by weight, representing that the resin composition is not specifically added with a flame retardant.

Unless otherwise specified, the suitable flame retardant for the present disclosure may be any one or more flame retardants used for preparing a resin-coated copper, a resin film, a laminate or a printed circuit board, such as but not limited to a phosphorus-containing flame retardant. For example, the phosphorus-containing flame retardant may comprise ammonium polyphosphate, hydroquinone bis(diphenyl phosphate), bisphenol A bis(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate), resorcinol bis(di-2,6-dimethylphenyl phosphate (such as commercially available PX-200), hydroquinone bis(di-2,6-dimethylphenyl phosphate (such as commercially available PX-201), 4,4'-biphenol bis(di-2,6-dimethylphenyl phosphate (such as commercially available PX-202), phosphazene (such as commercially available SPB-100, SPH-100 and SPV-100), melamine polyphosphate, 9,10-dihydro-9-oxa-10-phosphaphenanthrene-10-oxide (DOPO) and its derivatives (such as a di-DOPO compound) or resins (such as DOPO-HQ, DOPO-NQ, DOPO-PN and DOPO-BPN), DOPO-containing epoxy resin, diphenylphosphine oxide (DPPO) and its derivatives (such as a di-DPPO compound) or resins, melamine cyanurate, tri-hydroxyethyl isocyanurate or aluminium phosphinate (such as commercially available OP-930 and OP-935). DOPO-PN is a DOPO-containing phenol novolac resin, and DOPO-BPN may be a DOPO-containing bisphenol novolac resin, such as DOPO-BPAN (DOPO-bisphenol A novolac), DOPO-BPFN (DOPO-bisphenol F novolac) or DOPO-BPSN (DOPO-bisphenol S novolac).

The purpose of adding solvent is to change the solid content of the resin composition and to adjust the viscosity of the resin composition. For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof. The amount of solvent is not particularly limited and may be adjusted according to the viscosity required for the resin composition.

The silane coupling agent may include various silanes (such as but not limited to siloxane) or a combination thereof and may be further categorized according to the functional groups into amino silane, epoxide silane, vinyl silane, acrylate silane, methacrylate silane, hydroxyl silane, isocyanate silane, methacryloxy silane and acryloxy silane.

The coloring agent suitable for the present disclosure may comprise, but not limited to, dye or pigment.

The purpose of adding toughening agent is to improve the toughness of the resin composition. The toughening agent may comprise, but not limited to, rubber resin, carboxyl-terminated butadiene acrylonitrile rubber (CTBN rubber), core-shell rubber, or a combination thereof.

In addition to the aforesaid resin composition, the present disclosure also provides an article made from the resin composition, such as those suitable for use as components in various electronic products, including but not limited to a resin-coated copper, a resin film, a laminate or a printed circuit board.

For example, in one embodiment, the resin composition of the present disclosure may be used to make a resin-coated copper. For example, the resin composition from one embodiment of the present disclosure may be coated on a copper foil, followed by heating and baking to semi-cure the resin composition, so as to form a resin-coated copper. The suitable baking temperature may be 85° C. to 140° C., preferably 100° C. to 130° C., and the suitable baking time may be 1 minute to 6 minutes, preferably 3 minutes to 5 minutes. The resin-coated copper may comprise a copper foil and a semi-cured resin layer adhered on one side of the copper foil, wherein the semi-cured resin layer is obtained by semi-curing the resin composition.

For example, the resin-coated copper may further comprise a protective film layer. That is, the resin-coated copper may comprise a copper foil, a semi-cured resin layer adhered on one side of the copper foil and a protective film layer adhered on the other side of the copper foil opposite to the semi-cured resin layer.

For example, the type of copper foil used in the resin-coated copper is not limited and may be various copper foils commonly used in the art, such as but not limited to high temperature elongation (HTE) copper foil, reverse treated foil (RTF), reverse treated foil 2 (RTF2), very low profile (VLP) copper foil, hyper very low profile (HVLP) copper foil, hyper very low profile 2 (HVLP2) copper foil, carrier-attached copper foil, etc. The thickness of the copper foil is not limited and may be a common thickness of copper foil used in the art, such as but not limited to Toz (ounce), Hoz, 1 oz, 2 oz, etc. The carrier-attached copper foil may be various carrier-attached copper foils commonly used in the art, such as a carrier-attached copper foil including an 18 μm carrier copper foil and a 3 μm thin copper, wherein the 3 μm thin copper is attached to the 18 μm carrier copper foil. Examples of the carrier-attached copper foil may be a carrier-attached copper foil available from Mitsui Kinzoku under the product name MT18FL.

For example, the resin composition of the disclosure can be used to make a resin film, which is prepared by heating and baking to semi-cure the resin composition. The resin composition may be selectively coated on a supporting material, which includes but is not limited to a liquid crystal polymer film, a polytetrafluoroethylene film, a polyethylene terephthalate film (PET film), a polyimide film (PI film), a metal foil or a resin-coated copper, followed by heating and baking to semi-cure the resin composition to form the resin film.

For example, the resin composition of the present disclosure may be made into a laminate, which comprises at least two metal foils and at least one insulation layer disposed between the metal foils, wherein the insulation layer is made by curing the resin composition at high temperature and high pressure to the C-stage, a suitable curing temperature being for example between 180° C. and 230° C. and preferably between 200° C. and 220° C. and a suitable curing time being 90 to 150 minutes and preferably 90 to 120 minutes, a suitable lamination pressure being for example between 200 psi and 650 psi and preferably between 250 psi and 350 psi. The insulation layer may be obtained by curing the aforesaid resin film. The metal foil may contain copper, aluminum, nickel, platinum, silver, gold or alloy thereof, such as a copper foil. In a preferred embodiment, the laminate is a copper-clad laminate.

In one embodiment, the laminate may be further processed by trace formation processes to obtain a circuit board, such as a printed circuit board.

In one or more embodiments, the articles made from the resin composition disclosed herein may have at least one, preferably at least two, more or all, of the following properties:

- a copper foil peeling strength as measured by reference to IPC-TM-650 2.4.8 of greater than or equal to 4.0 lb/in, such as a copper foil peeling strength of between 4.0 lb/in and 4.8 lb/in;
- a resin flow as measured by reference to IPC-TM-650 2.3.17 of between 35.0% and 50.0%, such as a resin flow of between 37.9% and 48.4%; and a 5° C. shelf life of greater than or equal to 78 days, such as a 5° C. shelf life of between 78 days and 180 days.

Methods for measuring the aforesaid properties will be elaborated in detail below.

Raw materials below were used to prepare the resin compositions of various Examples and Comparative Examples of the present disclosure according to the amount listed in Table 1 to Table 4 and further fabricated to prepare test samples.

Materials and reagents used in the resin composition of Examples and Comparative Examples disclosed herein are listed below:

- NE-X-9470S: maleimide resin of Formula (1), available from DIC Corporation.
- BMI-70: bis(3-ethyl-5-methyl-4-maleimidophenyl)methane, available from K.I Chemical Industry Co., Ltd.
- BMI-3000: maleimide resin containing aliphatic long-chain structure, available from Designer Molecules Inc.
- Ricon 184MA6: maleic anhydride-adducted styrene-butadiene copolymer, available from Cray Valley.
- Ricon 130MA8: maleic anhydride-adducted polybutadiene, available from Cray Valley.
- Ricon 131MA5: maleic anhydride-adducted polybutadiene, available from Cray Valley.
- Ricon 100: styrene-butadiene copolymer, available from Cray Valley.
- B-1000: polybutadiene, available from Nippon Soda Co., Ltd.
- THQ: o-methylhydroquinone, available from Eumate International Corp.
- HQ: hydroquinone, available from Eumate International Corp.
- TMHQ: 2,3,5-trimethylhydroquinone, available from Eumate International Corp.
- TEMPO: 2,2,6,6-tetramethylpiperidine-1-oxyl free radical, available from Changzhou Jiana Chemical Co., Ltd.
- Tetramethylpiperidine nitroxide radical phosphite triester: available from Wuxi FuAn Chemical Plant.
- 3-(Aminomethyl)-2,2,5,5-tetramethyl-1-pyrrolidine oxide: available from Merck.

1,1,3,3-Tetramethylisoindoline-2-oxyl free radical: available from Changzhou Yipintang Chemical Co., Ltd.

25B: 2,5-dimethyl-2,5-di(t-butylperoxy)-3-hexyne, available from NOF Corporation.

SC2050 SMJ: spherical silica pre-treated by acrylic silane coupling agent, available from Admatechs. In the Tables, the amount symbol "R" of inorganic filler represents that the amount of inorganic filler is a multiple of the total amount of all other components excluding inorganic filler, curing accelerator and solvent in the resin composition of each Example or each Comparative Example. In the Tables, "R*200%" represents the amount of inorganic filler is 2 fold of the total amount of the aforesaid all other components. For example, in Example E1, R*200% represents that the amount of inorganic filler is 351 parts by weight (the total amount of all other components excluding inorganic filler, curing accelerator and solvent in Example E1 is 175.5 parts by weight, so the amount of inorganic filler is 175.5 parts by weight times 200%, which is 351 parts by weight).

Methyl ethyl ketone and toluene: commercially available, methyl ethyl ketone and toluene in a weight ratio of 1:10. The amount of solvent is shown as "PA" in the Tables to indicate a "proper amount" to represent an amount of solvent used to achieve a 55% to 63% total solid content (S/C=55% to 63%) of the resin composition.

Compositions (in part by weight) and test results of resin compositions of Examples and Comparative Examples are listed below, wherein the part by weight refers to the amount, in part by weight, of each component with a solid content of 100%. For example, Example E1 contains 75 parts by weight of a maleic anhydride-modified polyolefin resin, indicating the amount of the maleic anhydride-modified polyolefin resin, with a solid content of 100%, is 75 parts by weight.

Compositions and test results of resin compositions of Examples and Comparative Examples are listed below (in part by weight).

TABLE 1

Resin compositions of Examples (in part by weight) and test results

| Component | Name | E1 | E2 | E3 | E4 | E5 |
|---|---|---|---|---|---|---|
| maleimide resin of Formula (1) | NE-X-9470S | 100 | 100 | 100 | 100 | 100 |
| other maleimide resin | BMI-70 | | | | | |
| | BMI-3000 | | | | | |
| maleic anhydride-modified polyolefin resin | Ricon 184MA6 | 75 | 50 | 50 | | 35 |
| | Ricon 130MA8 | | | 50 | 65 | 50 |
| | Ricon 131MA5 | | | | | |
| other polyolefin resin | Ricon 100 | | | | | |
| | B-1000 | | | | | |
| free radical scavenger | THQ | 0.5 | 0.5 | 0.5 | 0.5 | 0.1 |
| | HQ | | | | | |
| | TMHQ | | | | | |
| | TEMPO | | | | | |
| | tetramethylpiperidine nitroxide radical | | | | | |
| | phosphite triester | | | | | |
| | 3-(aminomethyl)-2,2,5,5-tetramethyl-1-pyrrolidine oxide | | | | | |
| | 1,1,3,3-tetramethylisoindoline-2-oxyl free radical | | | | | |
| curing accelerator | 25B | 0.1 | 0.1 | 0.1 | 0.1 | 0.1 |
| inorganic filler | SC2050 SMJ | R*200% | R*200% | R*200% | R*200% | R*200% |
| solvent | MEK/toluene (1:10) | PA | PA | PA | PA | PA |
| **Property** | **Unit** | **E1** | **E2** | **E3** | **E4** | **E5** |
| copper foil peeling strength | lb/in | 4.3 | 4.0 | 4.4 | 4.0 | 4.1 |
| resin flow | % | 37.9 | 44.1 | 41.0 | 43.6 | 42.3 |
| 5° C. shelf life | day | 90 | 117 | 88 | 108 | 90 |

TABLE 2

Resin compositions of Examples (in part by weight) and test results

| Component | Name | E6 | E7 | E8 | E9 | E10 |
|---|---|---|---|---|---|---|
| maleimide resin of Formula (1) | NE-X-9470S | 100 | 100 | 100 | 100 | 100 |
| other maleimide resin | BMI-70 | | | | | |
| | BMI-3000 | | | | | |
| maleic anhydride-modified polyolefin resin | Ricon 184MA6 | 100 | 45 | 45 | 33 | 13 |
| | Ricon 130MA8 | | 15 | 15 | 40 | 13 |
| | Ricon 131MA5 | | | | 20 | 47 |

TABLE 2-continued

| | | | | | | |
|---|---|---|---|---|---|---|
| other polyolefin resin | Ricon 100 | | | | | |
| | B-1000 | | | | | |
| free radical scavenger | THQ | 1.5 | | | 0.4 | 0.4 |
| | HQ | | | | | |
| | TMHQ | | | | | |
| | TEMPO | | 0.5 | | | 0.1 |
| | tetramethylpiperidine nitroxide radical | | | 0.5 | | 0.1 |
| | phosphite triester | | | | | |
| | 3-(aminomethyl)-2,2,5,5-tetramethyl-1-pyrrolidine oxide | | | | | |
| | 1,1,3,3-tetramethylisoindoline-2-oxyl free radical | | | | | |
| curing accelerator | 25B | 0.1 | 0.1 | 0.1 | 0.01 | 0.6 |
| inorganic filler | SC2050 SMJ | R*200% | R*200% | R*200% | R*150% | R*250% |
| solvent | MEK/toluene (1:10) | PA | PA | PA | PA | PA |
| Property | Unit | E6 | E7 | E8 | E9 | E10 |
| copper foil peeling strength | lb/in | 4.2 | 4.2 | 4.1 | 4.8 | 4.6 |
| resin flow | % | 46.0 | 45.9 | 48.4 | 43.0 | 43.2 |
| 5° C. shelf life | day | 78 | 99 | 93 | 180 | 153 |

TABLE 3

Resin compositions of Comparative Examples (in part by weight) and test results

| Component | Name | C1 | C2 | C3 | C4 |
|---|---|---|---|---|---|
| maleimide resin of Formula (1) | NE-X-9470S | | | 100 | 100 |
| other maleimide | BMI-70 | 100 | | | |
| resin | BMI-3000 | | 100 | | |
| maleic anhydride- | Ricon 184MA6 | 75 | 50 | | |
| modified polyolefin | Ricon 130MA8 | | 50 | | |
| resin | Ricon 131MA5 | | | | |
| other polyolefin | Ricon 100 | | | 50 | 45 |
| resin | B-1000 | | | 50 | 15 |
| free radical | THQ | 0.5 | 0.5 | 0.5 | |
| scavenger | HQ | | | | |
| | TMHQ | | | | |
| | TEMPO | | | | 0.5 |
| | tetramethylpiperidine nitroxide radical | | | | |
| | phosphite triester | | | | |
| | 3-(aminomethyl)-2,2,5,5-tetramethyl-1-pyrrolidine oxide | | | | |
| | 1,1,3,3-tetramethylisoindoline-2-oxyl free radical | | | | |
| curing accelerator | 25B | 0.1 | 0.1 | 0.1 | 0.1 |
| inorganic filler | SC2050 SMJ | R*200% | R*200% | R*200% | R*200% |
| solvent | MEK/toluene (1:10) | PA | PA | PA | PA |
| Property | Unit | C1 | C2 | C3 | C4 |
| copper foil peeling strength | lb/in | 3.1 | 3.4 | 2.3 | 2.5 |
| resin flow | % | 41.0 | 55.0 | 68.3 | 64.4 |
| 5° C. shelf life | day | 63 | 80 | 99 | 82 |

TABLE 4

| Resin compositions of Comparative Examples (in part by weight) and test results | | | | | |
|---|---|---|---|---|---|
| Component | Name | C5 | C6 | C7 | C8 |
| maleimide resin of Formula (1) | NE-X-9470S | 100 | 100 | 100 | 100 |
| other maleimide resin | BMI-70 | | | | |
| | BMI-3000 | | | | |
| maleic anhydride-modified polyolefin resin | Ricon 184MA6 | 75 | 75 | 45 | 45 |
| | Ricon 130MA8 | | | 15 | 15 |
| | Ricon 131MA5 | | | | |
| other polyolefin resin | Ricon 100 | | | | |
| | B-1000 | | | | |
| free radical scavenger | THQ | | | | |
| | HQ | 0.5 | | | |
| | TMHQ | | 0.5 | | |
| | TEMPO | | | | |
| | tetramethylpiperidine nitroxide radical | | | | |
| | phosphite triester | | | | |
| | 3-(aminomethyl)-2,2,5,5-tetramethyl-1-pyrrolidine oxide | | | 0.5 | |
| | 1,1,3,3-tetramethylisoindoline-2-oxyl free radical | | | | 0.5 |
| curing accelerator | 25B | 0.1 | 0.1 | 0.1 | 0.1 |
| inorganic filler | SC2050 SMJ | R*200% | R*200% | R*200% | R*200% |
| solvent | MEK/toluene (1:10) | PA | PA | PA | PA |
| Property | Unit | C5 | C6 | C7 | C8 |
| copper foil peeling strength | lb/in | 3.3 | 3.2 | 3.5 | 3.0 |
| resin flow | % | 51.5 | 50.3 | 34.1 | 43.0 |
| 5° C. shelf life | day | 54 | 66 | 45 | 60 |

Samples (specimens) for the properties measured above were prepared as described below and tested and analyzed under specified conditions below.

1. Resin-Coated Copper

Resin composition (in part by weight) from each Example E1 to E10 or each Comparative Example C1 to C8 was separately added to a stirred tank and well-mixed to form a varnish. The varnish was coated on a copper foil (product name MLS-G2, an RTF with a thickness of Toz, available from Mitsui Kinzoku) to uniformly adhere the resin composition thereon, followed by heating and baking at 120° C. for 5 minutes to form a semi-cured resin layer, so as to obtain a resin-coated copper. The resin-coated copper has a copper foil layer and a semi-cured resin layer, wherein the semi-cured resin layer has a thickness of 40 m.

2. First Copper-Containing Laminate (Obtained by Laminating Two Resin-Coated Coppers and One Brown Oxide Treated Core)

Two resin-coated coppers of each Example or each Comparative Example obtained on the same day by the aforesaid method were prepared and stacked with a brown oxide treated core (such as a brown oxide treated core under a product name EM-S526, available from Elite Material Co., Ltd.), wherein the semi-cured resin layer of one resin-coated copper was adjacent to one side of the brown oxide treated core, and the semi-cured resin layer of the other resin-coated copper was adjacent to the other side of the brown oxide treated core, followed by lamination and curing for 2 hours in a high temperature laminator under a vacuum environment with a lamination pressure of 300 psi and a lamination temperature of 220° C. to form the first copper-containing laminate (obtained by laminating two resin-coated coppers and one brown oxide treated core).

3. Second Copper-Containing Laminate (Obtained by Laminating Two Resin-Coated Coppers and One Brown Oxide Treated Core)

The copper foils on both sides of the first copper-containing laminate were peeled off. The cleaning process was omitted, and the outer copper foil was directly electroplated to an overall copper layer thickness of 22 μm to obtain the second copper-containing laminate (obtained by laminating two resin-coated coppers and one brown oxide treated core).

For each sample, test items and test methods are described below.

Copper Foil Peeling Strength (P/S)

In the measurement of copper foil peeling strength, the aforesaid second copper-containing laminate (obtained by laminating two resin-coated coppers and one brown oxide treated core) was cut into a rectangular sample with a width of 24 mm and a length of greater than 60 mm, which was etched to remove surface copper foil to leave a rectangular copper foil with a width of 3.18 mm and a length of greater than 60 mm. The specimen was tested by using a tensile strength tester by reference to IPC-TM-650 2.4.8 at ambient temperature (about 25° C.) to measure the force (lb/in) required to pull off the copper foil from the laminate surface.

In the present technical field to which the present disclosure pertains, higher copper foil peeling strength is better. A difference in copper foil peeling strength of greater than or equal to 0.4 lb/in represents a substantial difference (i.e., significant technical difficulty) in copper foil peeling strength in different laminates. Articles made from the resin composition disclosed herein have a copper foil peeling strength as measured by reference to IPC-TM-650 2.4.8 of greater than or equal to 4.0 lb/in, such as between 4.0 lb/in and 4.8 lb/in.

Resin Flow

In the measurement of resin flow, two resin-coated coppers obtained on the same day by the aforesaid method were prepared and stacked so that the resin layers of the two resin-coated coppers were adjacent to the inner sides, with copper foil layers as two outer sides, which was cut into a size of 4 inch×4 inch (16 $in^2$), and then the two stacked resin-coated coppers were weighed to obtain W0. Next, one release film was stacked on each of the two outer sides of the aforesaid stacked resin-coated coppers and placed on a hot plate of a conventional resin flow press. Next, the measurement was performed by reference to IPC-TM-650 2.3.17, with lamination and curing under a lamination pressure of 1452 kgf/16 $in^2$ and a lamination temperature of 171° C. for 5 minutes, and the sample was taken out after cooling to room temperature. Next, after removing the cured resin overflowing from the four sides of the sample, the sample was weighed to obtain Wd. The measured value (%) of resin flow is equal to $[(W0-Wd)/(W0-2\times Wc_u)]\times 100\%$. $Wc_u$ is defined as the weight of MLS-G2 copper foil cut into a size of 4 inch×4 inch (16 $in^2$).

For example, the resin flow is preferably 35.0% to 50.0%. Resin composition with a resin flow of greater than 50.0% has excessive flow, which will cause the resin overflow during lamination and lead to insufficient resin content of the laminate; in contrast, resin composition with a resin flow of less than 35.0% has poor flow, resulting in insufficient resin filling property of the resin. Articles made from the resin composition disclosed herein have a resin flow as measured by reference to IPC-TM-650 2.3.17 of between 35.0% and 50.0%, such as between 37.9% and 48.4%.

5° C. Shelf Life

In the measurement of 5° C. shelf life, the resin flow on the 0th day of 5° C. shelf life was measured by reference to the aforesaid measurement method of resin flow and defined as RF Day 0. In addition, the same sample was placed at a constant temperature of 5° C. for n days (n is an integer of 1 to 200), and then the sample placed at a constant temperature of 5° C. for n days was measured by the aforesaid measurement method of resin flow, so as to obtain the resin flow of the nth day of 5° C. shelf life, which is defined as RF Day n. For example, the measured value (%) of resin flow variation rate is equal to (RF Day 0-RF Day n)/RF Day 0×100%. When the resin flow variation rate of 5° C. shelf life on the nth day is ≥8%, the sample is considered as failed, and the 5° C. shelf life of the sample is expressed as n−1 days.

In the present technical field to which the present disclosure pertains, longer 5° C. shelf life is better. A difference in 5° C. shelf life of greater than or equal to 12 days represents a substantial difference (i.e., significant technical difficulty) in 5° C. shelf life of different samples. Articles made from the resin composition disclosed herein have a 5° C. shelf life of greater than or equal to 78 days, such as between 78 days and 180 days.

The following observations can be made from Table 1 to Table 4.

If the resin composition contains 100 parts by weight of a maleimide resin, 50 to 100 parts by weight of a maleic anhydride-modified polyolefin resin and 0.1 to 1.5 parts by weight of a free radical scavenger, wherein the maleimide resin has a structure of Formula (1), and the free radical scavenger comprises o-methylhydroquinone, a nitroxide radical compound having a tetramethylpiperidine structure or a combination thereof, such as Examples E1 to E10, it can achieve improvements in properties including a copper foil peeling strength of greater than or equal to 4.0 lb/in, a resin flow of between 35.0% and 50.0% and a 5° C. shelf life of greater than or equal to 78 days. In contrast, Comparative Examples C1 to C8 fail to achieve desirable results in at least one of the aforesaid properties.

In contrast to Example E1, if the resin composition does not contain the maleimide resin of Formula (1) but contains BMI-70, such as Comparative Example C1, it will fail to achieve desirable results in copper foil peeling strength and 5° C. shelf life.

In contrast to Example E3, if the resin composition does not contain the maleimide resin of Formula (1) but contains BMI-3000, such as Comparative Example C2, it will fail to achieve desirable results in copper foil peeling strength and resin flow.

In contrast to Example E3, if the resin composition does not contain the maleic anhydride-modified polyolefin resin but contains a polyolefin resin not modified by a maleic anhydride, such as Comparative Example C3, it will fail to achieve desirable results in copper foil peeling strength and resin flow.

In contrast to Example E7, if the resin composition does not contain the maleic anhydride-modified polyolefin resin but contains a polyolefin resin not modified by a maleic anhydride, such as Comparative Example C4, it will fail to achieve desirable results in copper foil peeling strength and resin flow.

In contrast to Example E1, if the resin composition does not contain o-methylhydroquinone as free radical scavenger but contains hydroquinone (Comparative Example C5) and 2,3,5-trimethylhydroquinone (Comparative Example C6), it will fail to achieve desirable results in copper foil peeling strength, resin flow and 5° C. shelf life.

In contrast to Examples E7 and E8, if the resin composition does not contain a nitroxide radical compound having a tetramethylpiperidine structure as free radical scavenger but contains 3-(aminomethyl)-2,2,5,5-tetramethyl-1-pyrrolidine oxide, such as Comparative Example C7, it will fail to achieve desirable results in copper foil peeling strength, resin flow and 5° C. shelf life.

In contrast to Examples E7 and E8, if the resin composition does not contain a nitroxide radical compound having a tetramethylpiperidine structure as free radical scavenger but contains 1,1,3,3-tetramethylisoindoline-2-oxyl free radical, such as Comparative Example C8, it will fail to achieve desirable results in copper foil peeling strength and 5° C. shelf life.

Overall, the resin composition of the present disclosure and an article made therefrom, such as Examples E1 to E10, can all achieve desirable results at the same time including a copper foil peeling strength of greater than or equal to 4.0 lb/in, a resin flow of between 35.0% and 50.0% and a 5° C. shelf life of greater than or equal to 78 days.

The above detailed description and examples are merely illustrative in nature and are not intended to limit the embodiments of the subject matter or the applications and uses of such embodiments. As used herein, the term "exemplary" or similar expression means "serving as an example, instance, or illustration." Any implementation described herein as exemplary is not necessarily to be construed as preferred or advantageous over other implementations, unless otherwise specified.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description can provide those skilled in the art with a convenient guide for implementing the described one or more embodiments and equivalents thereof. Also, the scope defined by the claims includes known equivalents and foreseeable equivalents at the time of filing this patent application.

What is claimed is:

1. A resin composition, comprising 100 parts by weight of a maleimide resin, 50 to 100 parts by weight of a maleic anhydride-modified polyolefin resin and 0.1 to 1.5 parts by weight of a free radical scavenger, wherein:

the maleimide resin has a structure of Formula (1):

Formula (1)

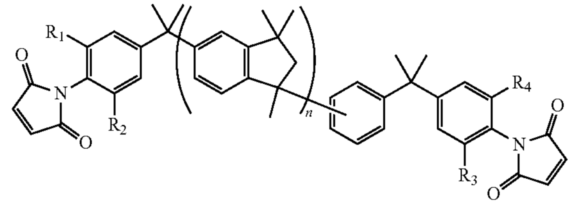

wherein n is an integer of 1 to 10, and $R_1$ to $R_4$ are each independently hydrogen or a C1 to C3 alkyl group;

the free radical scavenger comprises o-methylhydroquinone, a nitroxide radical compound having a tetramethylpiperidine structure or a combination thereof.

2. The resin composition of claim 1, wherein the maleic anhydride-modified polyolefin resin comprises a maleic anhydride-adducted polybutadiene-styrene copolymer, a maleic anhydride-adducted polybutadiene or a combination thereof.

3. The resin composition of claim 1, wherein the nitroxide radical compound having a tetramethylpiperidine structure has a structure of Formula (2):

Formula (2)

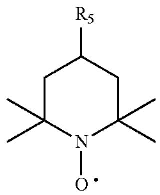

wherein $R_5$ is hydrogen, a C1 to C5 alkyl group, an amino group, a hydroxyl group, a keto group, a tetramethylpiperidine nitroxide radical-substituted phosphite ester group or a carboxyl group.

4. The resin composition of claim 1, further comprising inorganic filler, curing accelerator, flame retardant, solvent, silane coupling agent, coloring agent, toughening agent or a combination thereof.

5. An article made from the resin composition of claim 1, comprising a resin-coated copper, a resin film, a laminate or a printed circuit board.

6. The article of claim 5, having a copper foil peeling strength as measured by reference to IPC-TM-650 2.4.8 of greater than or equal to 4.0 lb/in.

7. The article of claim 5, having a resin flow as measured by reference to IPC-TM-650 2.3.17 of between 35.0% and 50.0%.

8. The article of claim 5, having a 5° C. shelf life of greater than or equal to 78 days.

* * * * *